United States Patent
Saitoh et al.

(10) Patent No.: US 6,537,369 B1
(45) Date of Patent: Mar. 25, 2003

(54) SIGEC SEMICONDUCTOR CRYSTAL AND PRODUCTION METHOD THEREOF

(75) Inventors: Tohru Saitoh, Osaka (JP); Yoshihiko Kanzawa, Osaka (JP); Katsuya Nozawa, Osaka (JP); Minoru Kubo, Mie (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/979,881

(22) PCT Filed: Mar. 27, 2001

(86) PCT No.: PCT/JP01/02524
§ 371 (c)(1),
(2), (4) Date: Nov. 27, 2001

(87) PCT Pub. No.: WO01/73852
PCT Pub. Date: Oct. 4, 2001

(30) Foreign Application Priority Data

Mar. 27, 2000 (JP) .......................... 2000-086154

(51) Int. Cl.⁷ .......................... C30B 23/02; C30B 29/36
(52) U.S. Cl. ................... 117/3; 117/2; 117/88; 117/951
(58) Field of Search ................. 428/446, 641; 117/2, 3, 84, 88, 103, 951

(56) References Cited

U.S. PATENT DOCUMENTS

| | | | | |
|---|---|---|---|---|
| 4,885,614 A | * | 12/1989 | Furukawa et al. | 357/16 |
| 5,523,592 A | * | 6/1996 | Nakagawa et al. | 257/96 |
| 5,906,708 A | * | 5/1999 | Robinson et al. | 156/657.1 |
| 6,399,970 B2 | * | 6/2002 | Kubo et al. | 257/194 |
| 6,403,976 B1 | * | 6/2002 | Saitoh et al. | 257/19 |

FOREIGN PATENT DOCUMENTS

| | | | |
|---|---|---|---|
| JP | 64-15912 | | 1/1989 |
| JP | 401015912 A | * | 1/1989 |
| JP | 06-224127 | | 8/1994 |
| JP | 410116919 A | * | 5/1998 |
| JP | 2000-269476 A | | 9/2000 |

OTHER PUBLICATIONS

International Search Report dated May 23, 2001.
H. Rucker et al., "Suppressed Diffussion of Boron and Carbon–Rich Silicon", Applied Physics Letters, vol. 73, No. 12, Sep. 21, 1998, pp. 1682–1684.
A. Ichikawa et al., "Epitaxial Growth of $Si_{1-x-y}Ge_xC_y$ Film on Si(100) in a $SiH_4$–$GeH_4$–$CH_3SiH_3$ Reaction", Thin Solid Films 369 (2000) pp. 161–170, No Month.
International Search Report dated Jun. 26, 2001.
"Suppression of Boron Outdiffusion in SiGe HBTs by Carbon Incorporation", L. D. Lanzerotti, J. C. Sturn, E. Stach, R. Hull, T. Buyuklimanli and C. Magee, International Electron Devices Meeting Technical Digest, Dec. 8, 1996, pp. 249 to 252.
"Electrical properties of boron–doped p–SiGeC grown on n–Si substrate", M. Ahoujja, Y. K. Yeo and R. L. Hengehold, Applied Physics Letters, vol. 77, No. 9, Aug. 28, 2000, pp. 1327 to 1329.

* cited by examiner

Primary Examiner—Deborah Jones
Assistant Examiner—Stephen Stein
(74) Attorney, Agent, or Firm—Nixon Peabody LLP; Donald R. Studebaker

(57) ABSTRACT

A B-doped $Si_{1-x-y}Ge_xC_y$ layer 102 (where $0<x<1$, $0.01 \leq y<1$) is epitaxially grown on a Si substrate 101 using a UHV-CVD process. In the meantime, in-situ doping is performed using $B_2H_6$ as a source gas of boron (B) which is an impurity (dopant). Next, the $Si_{1-x-y}Ge_xC_y$ layer 102 is annealed to form a B-doped $Si_{1-x-y}Ge_xC_y$ crystalline layer 103. In this case, the annealing temperature is set preferably at between 700° C. and 1200° C., both inclusive, and more preferably at between 900° C. and 1000° C., both inclusive.

9 Claims, 3 Drawing Sheets

SIGEC SEMICONDUCTOR CRYSTAL AND PRODUCTION METHOD THEREOF

TECHNICAL FIELD

The present invention relates to an SiGeC semiconductor crystal applicable to a bipolar transistor or a field-effect transistor and a method for producing the same.

BACKGROUND ART

The present invention relates to an SiGeC semiconductor crystal, which is a Group IV mixed crystal semiconductor, and a method for producing the same.

Conventionally, attempts have been made at fabricating a semiconductor device which operates faster than known Si semiconductor devices by stacking a Si layer and a semiconductor layer containing Si as a main ingredient thereof so as to form a heterojunction. $Si_{1-x}G_x$ and $Si_{1-x-y}Ge_xC_y$, which are mixed crystal semiconductors each formed using a Group IV element that is in the same group as Si, are expected as candidates for a material for forming a heterojunction with the Si layer. Particularly, as for an $Si_{1-x-y}Ge_xC_y$ mixed crystal semiconductor that is formed from three different elements, its band gap and lattice constant can be independently controlled by adjusting its composition, resulting in greater flexibility in semiconductor device design. Therefore, the $Si_{1-x-y}Ge_xC_y$ mixed crystal semiconductor has attracted much attention. For example, a lattice matching between $Si_{1-x-y}Ge_xC_y$ and Si crystals can be made by properly adjusting the composition of $Si_{1-x-y}Ge_xC_y$. A heterobarrier (band offset) can be also formed on both a conduction band edge and a valence band edge around the interface of the heterojunction between the Si and $Si_{1-x-y}Ge_xC_y$ layers by properly adjusting the composition of $Si_{1-x-y}Ge_xC_y$. Japanese Unexamined Patent Publication No. 10-116919, for example, discloses a field-effect transistor in which a two-dimensional electron gas serves as a carrier and which can operate at a high speed by utilizing a heterobarrier formed on the conduction band edge near the interface of Si/SiGeC layers.

Meanwhile, for producing $Si_{1-x-y}Ge_xC_y$ mixed crystals, use is now made of, for example, a chemical vapor deposition (CVD) process in which respective source gases of elements Si, Ge and C are dissolved so as to induce epitaxial growth of those elements on the Si or SiGe layers, or a molecular beam epitaxy (MBE) process in which respective source solids of the elements are heated and vaporized so as to induce crystal growth of the elements. In order to use an $Si_{1-x-y}Ge_xC_y$ layer as a part of a semiconductor device, the $Si_{1-x-y}Ge_xC_y$ layer is required to be doped with an impurity for generating a carrier, which will be a dopant so as to control the conductivity and specific resistance of the $Si_{1-x-y}Ge_xC_y$ layer. In the $Si_{1-x-y}Ge_xC_y$ layer, boron (B) and phosphorus (P) are used as a p-type dopant and an n-type dopant, respectively, in many cases. It is well known that the conductive type and specific resistance of a growth layer can be adjusted by doping the layer with a dopant during crystal growth.

Problems to be Solved

FIG. 4 is a graph indicating the result of an experiment conducted by the inventors for the purpose of consideration as to doping of an $Si_{1-x-y}Ge_xC_y$ layer and shows how the specific resistance of the $Si_{1-x-y}Ge_xC_y$ layer changed depending on the C content thereof. The $Si_{1-x-y}Ge_xC_y$ layer as a sample from which the data was collected is as-grown one obtained by being epitaxially grown by a CVD process with the use of $Si_2H_6$, $GeH_4$ and $SiH_3CH_3$ as respective source gases of elements of Si, Ge, and C and $B_2H_6$ as a source gas of boron (B) which is a p-type impurity (dopant) (i.e., through in-situ doping). In this experiment, the flow rates of $Si_2H_6$ and $GeH_4$ and the temperature of the $Si_{1-x-y}Ge_xC_y$ layer during the epitaxial growth thereof were kept constant and only the flow rate of $SiH_3CH_3$ was changed. As shown in FIG. 4, as for the sample having a C content of 0.45% or less, even when the C content was changed, the specific resistance of the sample stayed almost constant and relatively low. In contrast, as for the $Si_{1-x-y}Ge_xC_y$ layer having a C content of 1.6%, the specific resistance thereof remarkably increased. That is to say, it was clearly shown that clearly shown that the specific resistance of the $Si_{1-x-y}Ge_xC_y$ layer which had been epitaxially grown by this method increased to the level at which the layer would be no longer suitable for use as an active region of a semiconductor device (e.g., a channel region of FET, a base layer of a bipolar transistor).

FIG. 5 is a graph indicating the result of the secondary ion mass spectroscopy on a sample formed basically in the same method as the sample from which the data shown in FIG. 4 was collected and shows how the boron concentration of the $Si_{1-x-y}Ge_xC_y$ layer changed depending on the C content thereof. This is an experiment that was conducted to examine whether the specific resistance shown in FIG. 4 was affected by the boron concentration, because the doping efficiency of boron slightly changes, depending upon the C content of the $Si_{1-x-y}Ge_xC_y$ layer, when boron is introduced into the $S_{1-x-y}Ge_xC_y$ layer by an in-situ doping process. Note that the sample from which the data of FIG. 5 was collected is not identical to the sample from which the date of FIG. 4 was collected. As shown in FIG. 5, the B concentration of the $Si_{1-x-y}Ge_xC_y$ layer did not largely depend on the C content thereof. In addition, as also shown in FIG. 5, the B concentration of the $Si_{1-x-y}Ge_xC_y$ layer tended to increase as the C content of the $Si_{1-x-y}Ge_xC_y$ layer increased. That is to say, it was confirmed that the increase in the specific resistance of the sample having a B concentration of 1.6% shown in FIG. 4 was not caused due to the shortage of B concentration.

The inventors then assumed that an increase in specific resistance of regions having a relatively high C content in the $Si_{1-x-y}Ge_xC_y$ layer would be caused by B having not sufficiently been activated during an epitaxial growth associated with an in-situ doping. Conventionally, with an in-situ doping of a dopant during an epitaxial growth of a semiconductor layer (e.g., a Si layer or an $Si_{1-x-y}Ge_xC_y$ layer) using a CVD process, an annealing process for activating the dopant is considered as unnecessary because the dopant is activated concurrently with the epitaxial growth of the semiconductor layer, unlike an impurity doping by an ion implanting process. As shown in FIG. 4, the $Si_{1-x-y}Ge_xC_y$ layer, with its C content of 0.45% or less, has a relatively low specific resistance in the as-grown state. In such a case the $Si_{1-x-y}Ge_xC_y$ layer as-grown can be therefore used for an active region of a semiconductor device. However, it is likely that when the C content of the $Si_{1-x-y}Ge_xC_y$ layer increases, some phenomenon causing problems that cannot be solved by the conventional technology will appear. Particularly, it is empirically known that various properties of the layer are largely changed when the C content of the $Si_{1-x-y}Ge_xC_y$ layer increases to over 1%. Therefore, around 1% of C content can be considered to be the critical value where the specific resistance of the $Si_{1-x-y}Ge_xC_y$ layer starts increasing, although the data of FIG. 4 is not enough to confirm that.

DISCLOSURE OF INVENTION

It is an object of the present invention to provide an $Si_{1-x-y}Ge_xC_y$ semiconductor crystal applicable as an active region of a semiconductor device and a method for producing the same by taking measures to activate boron (B), particularly for an $Si_{1-x-y}Ge_xC_y$ layer having a relatively high degree of carbon (C) content which goes just over 1%.

A method for producing an SiGeC semiconductor crystal according to the present invention includes the steps of: a) epitaxially growing an SiGeC semiconductor crystal on a substrate, the SiGeC semiconductor crystal doped with a carrier generating impurity on a substrate the SiGeC semiconductor having a composition represented by $Si_{1-x-y}Ge_xC_y$ (where $0<x<1$, $0.01 \leq y<1$); and b) performing an annealing process to activate the carrier generating impurity in the SiGeC semiconductor crystal.

In this method, it was empirically confirmed that the specific resistance of an SiGeC layer could be reduced. Conventionally, it has been considered that an in-situ doped impurity is activated during an epitaxial growth. However, this idea is not applicable to the SiGeC layer and thus it is assumed that even the in-situ doped impurity can be activated enough by an annealing process.

The temperature in the annealing process is within the range from 700° C. to 1000° C., both inclusive, and thereby the impurity can be particularly effectively activated.

If the epitaxially growing step includes a CVD process using, as a source, a hydride which is made of at least one material selected from the group consisting of Si, Ge, C and B, the present invention is of great significance.

A SiGeC semiconductor crystal of the present invention includes two or more alternately stacked sets of: an $Si_{1-z}Ge_z$ (where $0<z<1$) layer which contains a carrier generating impurity; and an $Si_{1-w}C_w$ (where $0.01 \leq w<1$) layer which has a carrier generating impurity higher in concentration than the $Si_{1-z}Ge_z$ layer, and functions as an SiGeC semiconductor crystal which has a composition represented by $Si_{1-x-y}Ge_xC_y$ (where $0<x<1$, $0.01 \leq y<1$).

Thus, the $Si_{1-z}Ge_z$ layer and the $Si_{1-w}C_w$ layer are unitized to function as a single SiGeC semiconductor crystal. At the same time, in the $Si_{1-z}Ge_z$ layer, by utilizing activation of the carrier generating impurity as-grown without any special process performed, the SiGeC semiconductor crystal with a relatively low specific resistance which is suitable for an active region of a semiconductor device can be achieved.

If the $Si_{1-z}Ge_z$ layer and the $Si_{1-w}C_w$ layer are each smaller in thickness than the case where a discrete quantum state is generated in the layers, they can more reliably be unitized to function as a single SiGeC semiconductor crystal.

Specifically, each of the $Si_{1-z}Ge_z$ layer and the $Si_{1-w}C_w$ layer preferably has a thickness of 1.0 nm or less.

BEST MODE FOR CARRYING OUT THE INVENTION

Hereinafter, embodiments of an SiGeC semiconductor crystal according to the present invention and a method for producing the same will be described with reference to the accompanying drawings.

(First Embodiment)

Figure 1A:
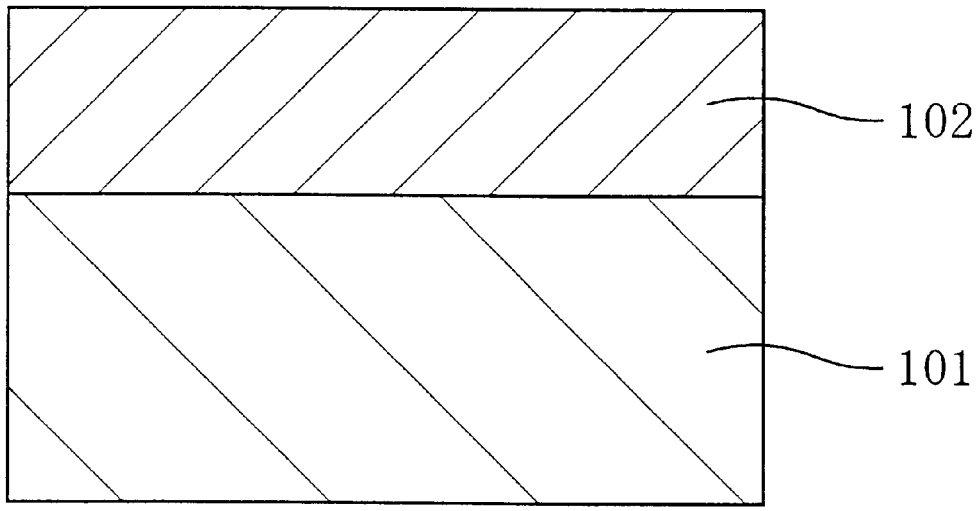
FIGS. 1A and 1B are cross-sectional views schematically illustrating respective process steps for producing B-doped $Si_{1-x-y}Ge_xC_y$ semiconductor crystals according to a first embodiment of the present invention.
Figure 1A:
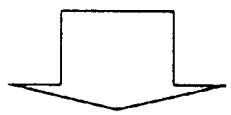
Figure 1B:
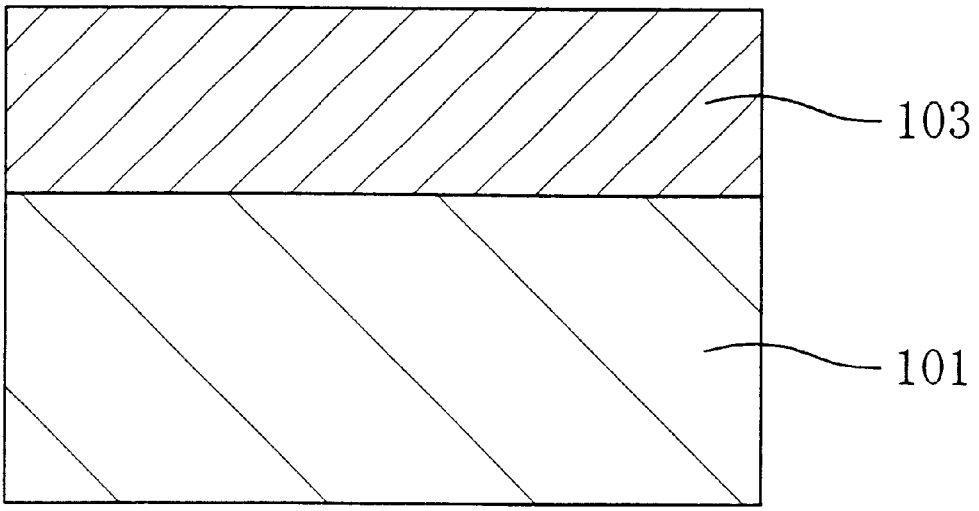
Figure 2:
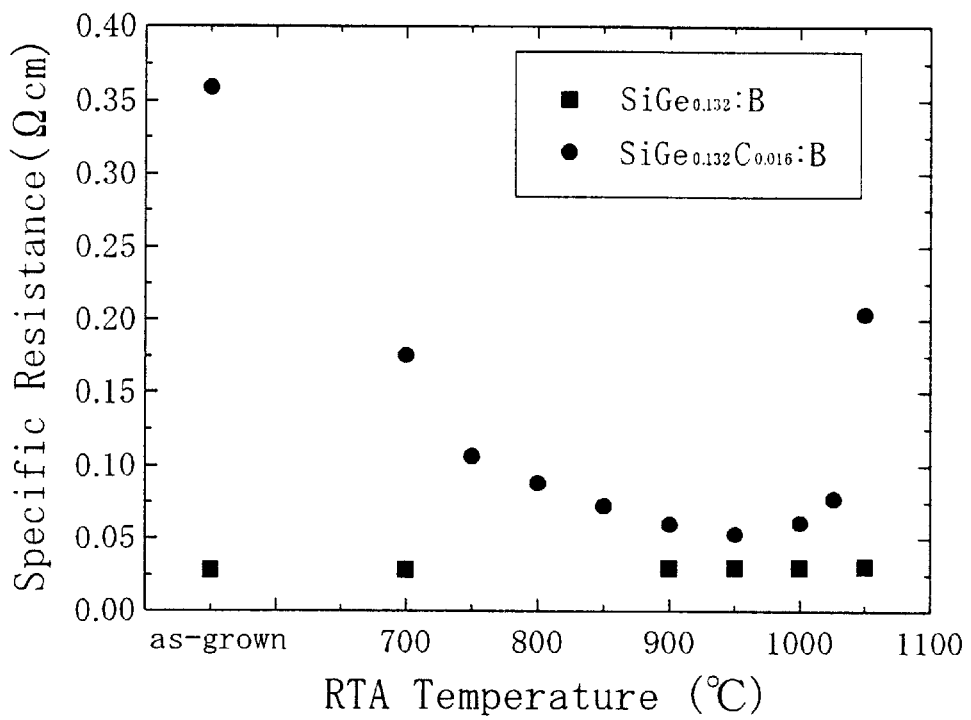
FIG. 2 is a graph showing the data on how the specific resistance of the B-doped $Si_{1-x-y}Ge_xC_y$ semiconductor crystals changed with the temperature in RTA according to the producing method of the present invention.

FIGS. 1A and 1B are cross-sectional views schematically illustrating respective process steps for producing a B-doped $Si_{1-x-y}Ge_xC_y$ semiconductor according to a first embodiment of the present invention. FIG. 2 is a graph indicating the data on how the specific resistance of B-doped $Si_{1-x-y}Ge_xC_y$ semiconductor crystals changed with the temperature in RTA according to the producing method of the present invention.

First, in the process step shown in FIG. 1A, a B-doped $Si_{1-x-y}Ge_xC_y$ layer 102 with a thickness of approximately 300 nm is epitaxially grown, on a Si substrate 101 whose principal surface is the {001} surface, by an ultra high vacuum chemical vapor deposition (UHV-CVD) process. In the meantime, $Si_2H_6$, $GeH_4$ and $SiH_3CH_3$ are used as respective source gases of elements Si, Ge and C which constitute the $Si_{1-x-y}Ge_xC_y$ layer, and $B_2H_6$ is used as a source gas of boron (B) which is a p-type impurity (dopant) (i.e., these gases are in-situ doped). In this case, the respective flow rates of $Si_2H_6$ and $GeH_4$ and the temperature of $Si_{1-x-y}Ge_xC_y$ layer during an epitaxial growth (at approximately 490° C.) are kept constant and only the flow rate of $SiH_3CH_3$ is changed. The growth pressure is approximately 0.133 Pa ($=1 \times 10^{-3}$ Torr) and the growth temperature is 490° C. According to the results of the evaluation of the composition of the B-doped $Si_{1-x-y}Ge_xC_y$ layer 102 by an X-ray diffraction analysis, the contents of Si, Ge and C thereof were 82.5%, 13.2% and 1.6%, respectively. Also, According to the result of the evaluation of the $Si_{1-x-y}Ge_xC_y$ layer 102 by an secondary ion mass spectroscopy, the B concentration was $2.6 \times 10^{18}$ atoms·cm$^{-3}$.

Next, in the process step shown in FIG. 1B, the $Si_{1-x-y}Ge_xC_y$ layer 102 is annealed by rapid thermal annealing (RTA), thereby forming a B-doped $Si_{1-x-y}Ge_xC_y$ crystalline layer 103. Here, annealing is made at, e.g., approximately 950° C. at highest, for an approximately 15 seconds duration at the highest temperature, in an atmosphere of nitrogen ($N_2$) at 1 atmospheric pressure.

FIG. 2, is a graph showing the annealing temperature (highest RTA temperature) dependency of the specific resistance of the B-doped $Si_{1-x-y}Ge_xC_y$ crystalline layer 103 when the RTA temperature (highest temperature) was changed. Note that the data shown in FIG. 2 was collected under the condition in which the highest RTA temperature was changed from 700° C. through 1050° C., both inclusive, and the annealing time was constantly kept at 15 seconds. In the FIG. 2, the data marked with (●) indicates the specific resistance of the B-doped $Si_{1-x-y}Ge_xC_y$ crystalline layer 103. The data marked with (■) indicates the annealing temperature dependency of the specific resistance of a B-doped $Si_{1-x}Ge_x$ layer (Ge content of 13%) which was formed for comparison with the inventive crystalline layer. As shown in the FIG. 2, the specific resistance of the B-doped $Si_{1-x-y}Ge_xC_y$ crystalline layer 103 (●) monotonously decreases as the annealing temperature increases in the range from 700° C. to 900° C., both inclusive. When the annealing temperature is in the range from 900° C. to 1000° C., both inclusive, the specific resistance of the B-doped $Si_{1-x-y}Ge_xC_y$ crystalline layer 103 stays approximately constant and then when the annealing temperature becomes over 1000° C., the specific resistance starts increasing. It can be seen that the B-doped $Si_{1-x-y}Ge_xC_y$ crystalline layer 103 has a smaller specific resistance at any temperature when annealed after having been epitaxially grown than when being in the as-grown state. On the other hand, the specific resistance of the B-doped $Si_{1-x}Ge_x$ layer (■) stays low and approximately constant whether or not the $Si_{1-x}Ge_x$ layer is subjected to the RTA. That is to say, it is not significant at all to anneal the B-doped $Si_{1-x}Ge_x$ layer for activation after the layer has been epitaxially grown.

It can be understood from the above description that the specific resistance of an $Si_{1-x-y}Ge_xC_y$ layer can be reduced by forming the $Si_{1-x-y}Ge_xC_y$ layer through epitaxial growth associated with in-situ doping and then annealing the $Si_{1-x-y}Ge_xC_y$ layer. Specifically, as for the $Si_{1-x-y}Ge_xC_y$ layer which has been epitaxially grown concurrently with in-situ doping to contain a 1% or more dopant therein, it has a problem of high specific resistance. However, annealing the $Si_{1-x-y}Ge_xC_y$ layer after its epitaxial growth can prevent an increase in the specific resistance.

As shown in FIG. 2, annealing (RTA) particularly in the range from 700° C. to 1020° C., both inclusive, provides the effect of ensuring that the specific resistance of the $Si_{1-x-y}Ge_xC_y$ layer is reduced.

Furthermore, it is also shown that when the $Si_{1-x-y}Ge_xC_y$ layer is annealed at a temperature in the range from 900° C. to 1000° C., both inclusive, the effect of reducing the specific resistance thereof is remarkable.

In this embodiment, the case of using boron (B) as a dopant for generating a carrier has been described. However, the present invention is not limited to this embodiment but is applicable to the case of using phosphorus as a dopant for generating a carrier.

In a paper ("Epitaxial growth of $Si_{1-x-y}Ge_xC_y$ film on Si(100) in an $SiH_4$—$GeH_4$—$CH_3SiH_3$ reaction", A. Ichikawa et. al., Thin Solid Film 369(2000) 167-170) published after a prior application (Japanese Application No. 2000-086154) based on which this application claims for priority had been filed, it was reported that a P-doped $Si_{1-x-y}Ge_xC_y$ layer which had been formed though epitaxial growth associated with in-situ doping had an increased specific resistance even in the as-grown state, but it was not mentioned how the specific resistance could be prevented from increasing. That is to say, the reduced specific resistance of the $Si_{1-x-y}Ge_xC_y$ layer having a relatively high C content was not achieved. In contrast, the present invention is of great significance in that, according to the present invention, the specific resistance of an impurity-doped $Si_{1-x-y}Ge_xC_y$ layer can be reduced by a relatively easy process.

When a device such as a field-effect transistor and a bipolar transistor is fabricated using $Si_{1-x-y}Ge_xC_y$ crystals, the above-described annealing process also provides the same effects with the use in combination with another annealing process such as, e.g., a process for activating source and drain regions or a process for activating polysilicon electrodes.

In this embodiment, the $Si_{1-x-y}Ge_xC_y$ layer is epitaxially grown by a UHV-CVD process. However, the present invention is not limited to this embodiment, the same effects can be obtained for an $Si_{1-x-y}Ge_xC_y$ crystalline layer which is formed by another process including a low pressure chemical vapor deposition (LP-CVD) process.

In this embodiment, the annealing process is effected by RTA. However, the same effects can also be achieved by any other annealing process including a furnace annealing process.

(Second Embodiment)

Next, the structure of a B-doped $Si_{1-x-y}Ge_xC_y$ crystalline layer according to a second embodiment of the present invention and a method for producing the same will be described.

Figure 3:
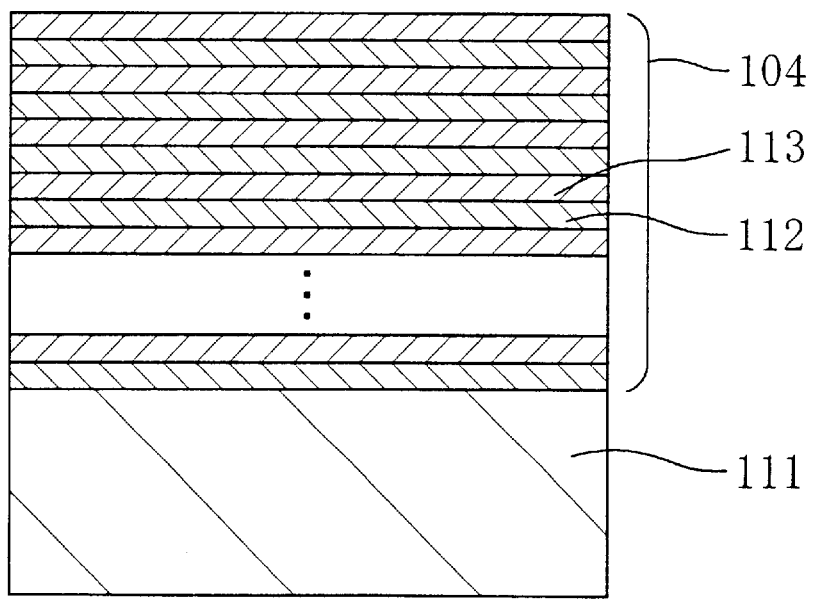
FIG. 3 is a cross-sectional view schematically illustrating the structure of the $Si_{1-x-y}Ge_xC_y$ semiconductor crystals according to a second embodiment of the present invention.

FIG. 3 is a cross-sectional view schematically illustrating the superlattice structure of a semiconductor according to the embodiment of the present invention. Epitaxially grown on a Si substrate 111 by a UHV-CVD process was a superlattice structure 104 in which a B-doped SiGe layer 113 (1 nm thick) containing boron (B) as a carrier generating impurity and having a composition represented by $Si_{1-z}Ge_z$ (where 0<z<1), and a non-doped SiC layer 112 (1 nm thick) containing a carrier generating impurity lower in concentration than the B-doped SiGe layer 113 and having a composition represented by $Si_{1-w}C_w$ (where $0.01 \leq w < 1$) have been stacked 150 times. In the meantime, $Si_2H_6$, $GeH_4$, and $SiH_3CH_3$ were used as respective source gases of elements Si, Ge, and C, and $B_2H_6$ as a source gas of boron (B) which is a p-type dopant (i.e., these gases were in-situ doped). In this case, the growth pressure was approximately 0.133 Pa (=$1 \times 10^{-3}$ Torr) and the growth temperature was 490° C. As a result of evaluation of the composition of the B-doped SiGe layer 113 by an X-ray diffraction analysis, the Ge content was 26.4%. As a result of evaluation of the composition of the non-doped SiC layer 113 by the X-ray diffraction analysis, the C content was 3.2%. As a result of evaluation of the composition of the B-doped SiGe layer 112 by a secondary ion mass spectroscopy, the B concentration was $5.2 \times 10^{18}$ atoms·$cm^{-3}$. The non-doped SiC layer 113 was not intentionally doped with B, but contains B at a very low concentration because of residue or diffusion of the impurity doping gas.

The superlattice structure 104 formed by stacking the $Si_{1-z}Ge_z/Si_{1-w}C_w$ layers according to this embodiment has such a thin superlattice structure that an SiC layer and an SiGe layer exhibit no quantum effect, and thus no discrete quantum state will be generated. Properties of the SiC layer 112 and the SiGe layer 113 are averaged (in other word, united) and thus the whole superlattice structure 104 functions as a single $Si_{1-x-y}Ge_xC_y$ layer (where 0<x<1, $0.01 \leq y < 1$). In the $Si_{1-x-y}Ge_xC_y$ layer ($Si_{1-z}Ge_z/Si_{1-w}C_w$ short-period superlattice), the average concentrations of Si is approximately 85.2%, the average concentrations of Ge is approximately 13.2%, the average concentrations of C approximately 1.6% and the average concentration of B is approximately $2.6 \times 10^{18}$ $cm^{-3}$, and therefore the $Si_{1-x-y}Ge_xC_y$ layer can be considered to have the same composition as the $Si_{1-x-y}Ge_xC_y$ layer shown in FIG. 1.

Therefore, the same effects as described in the first embodiment can be achieved according to this embodiment. Furthermore, this embodiment has the advantage that in the process steps of producing the SiGeC semiconductor crystals of this embodiment, an annealing process is not required unlike in the first embodiment and therefore reduction in resistance can be realized in an as-grown state.

Figure 4:
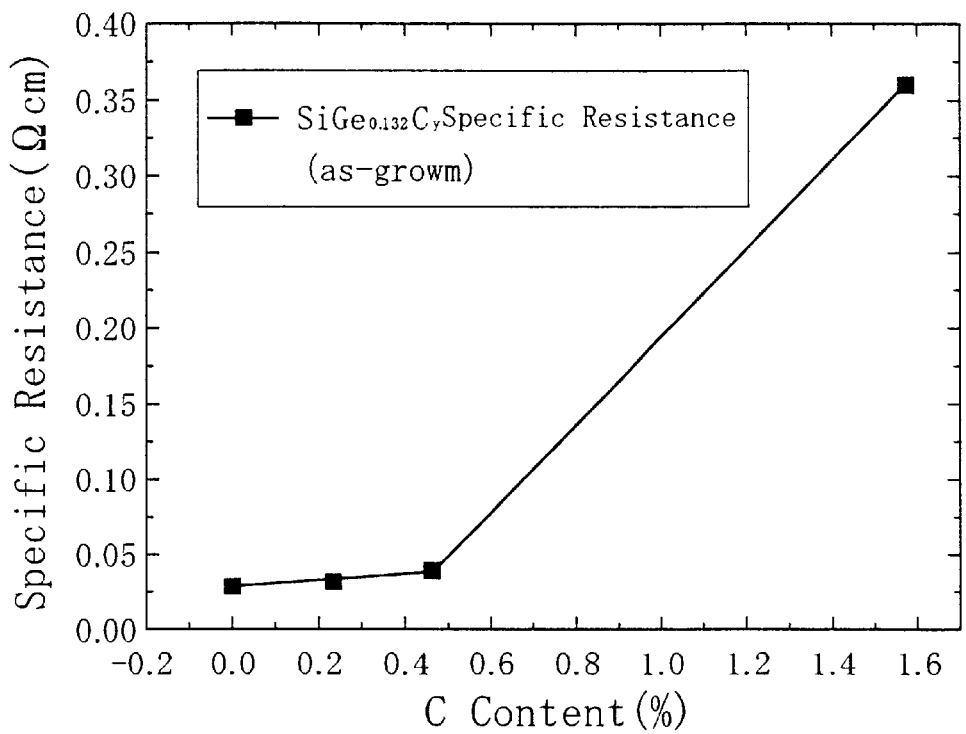
FIG. 4 is a graph indicating the dependency of the specific resistance of a B-doped $Si_{1-x-y}Ge_xC_y$ layer upon the C content thereof.
Figure 5:
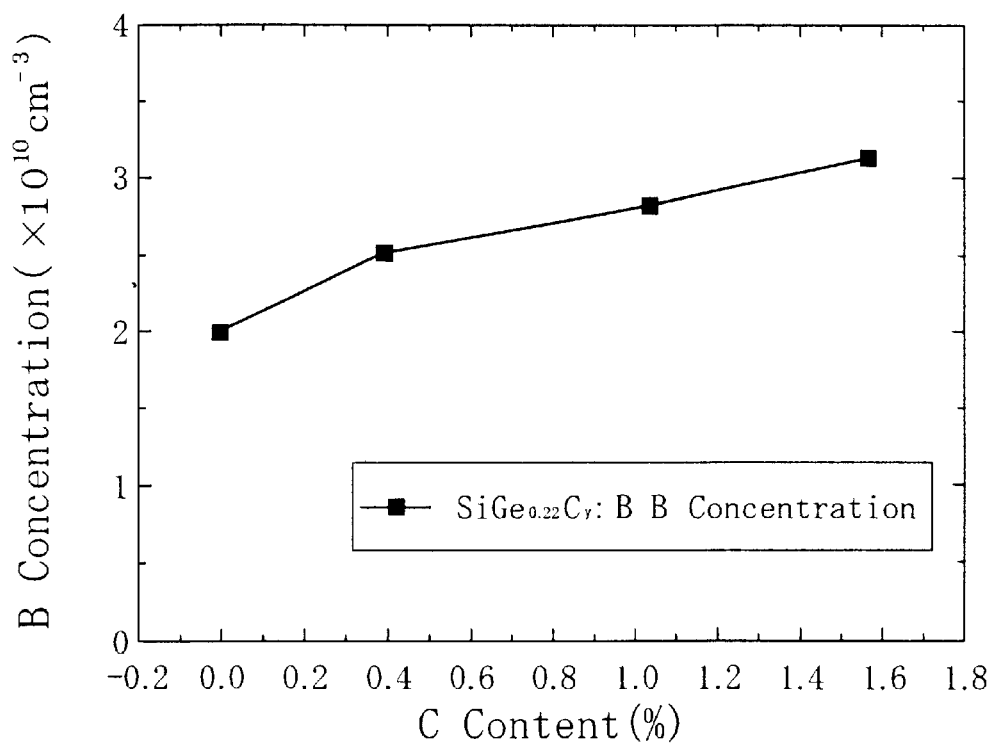
FIG. 5 is a graph indicating the dependency of the B concentration of the $Si_{1-x-y}Ge_xC_y$ layer upon the C content thereof, which have been obtained as the result of a secondary ion mass spectroscopy.

In the superlattice structure 104, only the SiGe layer 113 is doped with B and the SiC layer 112 contains very little B. As shown in FIGS. 2 and 4, B in the SiGe layer 113 is activated as a dopant in the as-grown state. A minute amount of C could be mixed into the SiGe layer 113 in the course of production. However, the existence of C up to approximately 0.45% of the SiGe layer 113 would not increase the specific resistance of the SiGe layer as shown in FIG. 4.

In this embodiment, the SiC layer 112 and the SiGe layer 113 are both 1 nm in thickness and a superlattice structure obtained by stacking these two layers 150 times is used. However, the present invention is not limited to this embodiment. By stacking an $Si_{1-z}Ge_z$ layer which includes a carrier generating impurity at a high concentration and an $Si_{1-w}C_w$ layer which contains almost no carrier generating impurity, the carrier generating impurity can be reliably activated and therefore a multilayer structure which functions as a single $Si_{1-x-y}Ge_xC_y$ layer can be achieved. Note that, when a quantum state is generated in the $Si_{1-z}Ge_z$ layer or the $Si_{1-w}C_w$ layer, some other characteristics may possibly appear in the layers. Therefore, the $Si_{1-z}Ge_z$ layer and the $Si_{1-w}C_w$ layer are preferably formed as thin as no quantum state will be generated.

Particularly, if the $Si_{1-z}Ge_z$ layer and the $Si_{1-w}C_w$ layer are 1 nm or less in thickness, this ensures that each layer has no quantum state. Therefore, the thickness of each layer is preferably 1 nm or less. Note that the thicknesses of the $Si_{1-z}Ge_z$ and $Si_{1-w}C_w$ layers may be different from each other.

In this embodiment, the $Si_{1-x-y}Ge_xC_y$ layer is formed by epitaxially growing the $Si_{1-z}Ge_z$ and $Si_{1-w}C_w$ layers in an alternate manner by the UHV-CVD process. However, the present invention is not limited to this embodiment and the same effects can be achieved in the $Si_{1-x-y}Ge_xC_y$ layer formed from the $Si_{1-z}Ge_x$ and $Si_{1-w}C_w$ layers which have been formed by another growing process including a low-pressure chemical vapor deposition (LP-CVD) process.

INDUSTRIAL APPLICABILITY

This invention is applicable to a field-effect transistor or a bipolar transistor which include an Si/SiGeC or SiGe/SiGeC hetero structure.

What is claimed is:

1. A method for producing an SiGeC semiconductor crystal comprising the steps of:

a) epitaxially growing an SiGeC semiconductor crystal doped with a carrier generating impurity on a substrate, the SiGeC semiconductor crystal having a composition represented by $Si_{1-x-y}Ge_xC_y$ (where $0<x<1$, $0.0045 \leq y<1$); and b) performing an annealing process to achieve the carrier generating impurity in the SiGeC semiconductor crystal and thereby a specific resistance of the SiGeC semiconductor crystal is approximately 0.2 Ω cm or less.

2. A method for producing an SiGeC semiconductor crystal according to claim 1, characterized in that the temperature in the annealing process is within the range from 700° C. to 1020° C., both inclusive.

3. A method for producing an SiGeC semiconductor crystal according to claim 1, characterized in that the epitaxially growing step comprises a CVD process using, as a source, a hydride which is made of at least one material selected from the group consisting of Si, Ge, and B.

4. A method for producing an SiGeC semiconductor crystal according to claim 1, characterized in that the temperature in the annealing process is within the range from 800° C. to 1020° C., both inclusive.

5. A method for producing an SiGe semiconductor crystal according to claim 4, wherein in the step b), a specific resistance of the SiGeC semiconductor crystal is approximately 0.1 Ω cm or less.

6. A method for producing an SiGeC semiconductor crystal according to claim 1, characterized in that the temperature in the annealing process is within the range from 850° C. to 1020° C., both inclusive.

7. A method for producing an SiGe semiconductor crystal according to claim 6, wherein in the step b), a specific resistance of the SiGeC semiconductor crystal is approximately 0.075 Ω cm or less.

8. A method for producing an SiGeC semiconductor crystal according to claim 1, characterized in that the temperature in the annealing process is within the range from 900° C. to 1000° C., both inclusive.

9. A method for producing an SiGe semiconductor crystal according to claim 8, wherein in the step b), a specific resistance of the SiGeC semiconductor crystal is approximately 0.06 Ω cm or less.

* * * * *

UNITED STATES PATENT AND TRADEMARK OFFICE
CERTIFICATE OF CORRECTION

PATENT NO.   : 6,537,369 B1
DATED        : March 25, 2003
INVENTOR(S)  : Tohru Saitoh et al.

It is certified that error appears in the above-identified patent and that said Letters Patent is hereby corrected as shown below:

<u>Column 8,</u>
Line 17, insert -- C -- after "Ge,".

Signed and Sealed this

Tenth Day of February, 2004

JON W. DUDAS
*Acting Director of the United States Patent and Trademark Office*